(12) United States Patent
Kim

(10) Patent No.: US 9,502,084 B2
(45) Date of Patent: Nov. 22, 2016

(54) SEMICONDUCTOR INTEGRATED CIRCUIT WITH DATA LATCH CONTROL

(71) Applicant: SK hynix Inc., Icheon-si Gyeonggi-do (KR)

(72) Inventor: Jae Il Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/875,185

(22) Filed: Oct. 5, 2015

(65) Prior Publication Data

US 2016/0027483 A1    Jan. 28, 2016

Related U.S. Application Data

(62) Division of application No. 14/148,254, filed on Jan. 6, 2014, now Pat. No. 9,183,899.

(30) Foreign Application Priority Data

Nov. 1, 2013   (KR) ........................ 10-2013-0132393

(51) Int. Cl.
*G11C 7/00*   (2006.01)
*G11C 7/10*   (2006.01)
*G11C 7/22*   (2006.01)

(52) U.S. Cl.
CPC ............. *G11C 7/106* (2013.01); *G11C 7/1039* (2013.01); *G11C 7/1066* (2013.01); *G11C 7/222* (2013.01)

(58) Field of Classification Search
CPC ...................................................... G11C 7/106
USPC ............................................ 365/193, 230.03
See application file for complete search history.

(56) References Cited

U.S. PATENT DOCUMENTS

2007/0250677 A1* 10/2007 Ware .................... G11C 7/1006
711/167

* cited by examiner

*Primary Examiner* — Hoai V Ho
(74) *Attorney, Agent, or Firm* — William Park & Associates Ltd.

(57) ABSTRACT

A semiconductor integrated circuit may include: a memory block partitioned into a first region and a second region; a data latch unit configured to latch data outputted from the memory block in response to a control signal; and a control circuit configured to generate a source signal separated into an odd order and an even order in response to a column access signal consecutively inputted to access the first region or the second region, and to generate the control signal in response to the source signal.

5 Claims, 8 Drawing Sheets

SEMICONDUCTOR INTEGRATED CIRCUIT WITH DATA LATCH CONTROL

CROSS-REFERENCES TO RELATED APPLICATION

The present application is a Division of U.S. application Ser. No. 14/148,254, filed on Jan. 6, 2014, and the present application claims priority under 35 U.S.C. §119(a) to Korean application number 10-2013-0132393, filed on Nov. 1, 2013, in the Korean Intellectual Property Office, which is incorporated herein by reference in its entirety.

BACKGROUND

1. Technical Field

Various embodiments relate to a semiconductor circuit, and more particularly, to a semiconductor integrated circuit.

2. Related Art

A semiconductor integrated circuit may include a plurality of unit memory regions, for example, a plurality of memory banks.

The plurality of memory banks of the semiconductor integrated circuit may be independently controlled, respectively.

In addition, each of the memory bank may be divided into an up bank and a down bank.

For example, data of the up bank is outputted through a data line when a read command for accessing the up bank is applied and data of the down bank is outputted through a data lines when a read command for accessing the down bank is applied.

The semiconductor integrated circuit may include a data latch circuit, e.g. a pipe latch, as a necessary component for providing a prefetch function according to a high-speed operation.

The pipe latch receives data outputted from a memory bank according to a control signal for controlling an input of the pipe latch.

SUMMARY

In an embodiment of the present invention, a semiconductor integrated circuit includes: a memory block partitioned into a first region and a second region; a data latch unit configured to latch data outputted from the memory block in response to a control signal; and a control circuit configured to generate a source signal separated into an odd order and an even order in response to a column access signal consecutively inputted to access the first region or the second region, and to generate the control signal in response to the source signal.

In an embodiment of the present invention, a semiconductor integrated circuit includes: a data latch unit configured to latch data outputted from a memory block in response to a control signal; an order control unit configured to generate an order strobe signal pair by separating each strobe signal into an even order and an odd order in response to the strobe signal for access to the memory block; a signal processing unit configured to generate an order source signal pair by controlling a timing of the order strobe signal pair; and a control signal generation unit configured to generate the control signal by passing one of the order source signal pair, when the other of the order source signal pair is inactivated.

In an embodiment of the present invention, a semiconductor integrated circuit includes: a memory block comprising a first region and a second region; a data latch unit configured to latch data outputted from the memory block in response to a control signal; an order control unit configured to generate a first order strobe signal pair and a second order strobe signal pair, in which a first strobe signal for access to the first region and a second strobe signal for access to the second region are individually separated into an even order and an odd order, in response to the first strobe signal and the second strobe signal; a signal processing unit configured to control each timing of the first order strobe signal pair and the second order strobe signal pair, and to generate a first order source signal pair and a second order sources signal pair; and a control signal generation unit configured to generate the control signal by passing one of two signals, which are obtained by combining signals of the first order source signal pair and the second order sources signal pair by even orders and by odd orders, when the other of the two signals is inactivated.

BRIEF DESCRIPTION OF THE DRAWINGS

Features, aspects, and embodiments are described in conjunction with the attached drawings, in which.

DETAILED DESCRIPTION

Figure 1A:
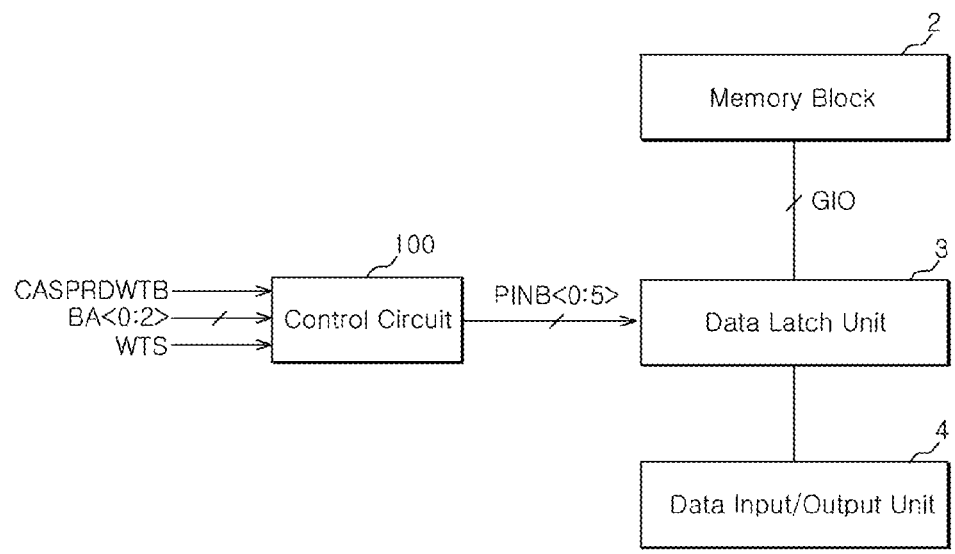
FIG. 1A is a block diagram illustrating the configuration of a semiconductor integrated circuit according to one embodiment of the present invention.

Hereinafter, a semiconductor integrated circuit according to the present invention will be described below with reference to the accompanying drawings through exemplary embodiments. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention As illustrated in FIG. 1, a semiconductor integrated circuit 1 according to one embodiment of the present invention may include a memory block 2, a memory latch unit 3, a data input/output unit 4 and a control circuit 100.

Figure 1B:
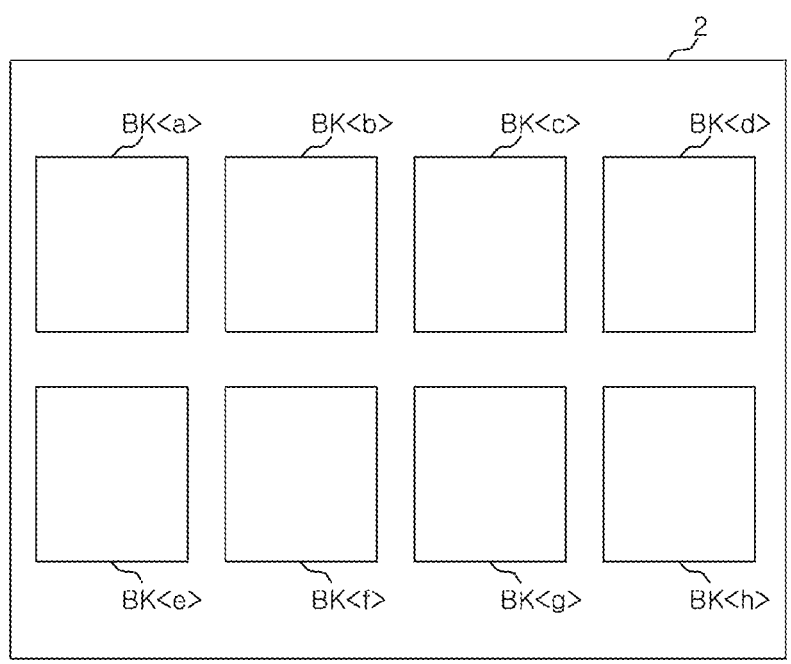
FIG. 1B is a plan view illustrating the memory block according to one embodiment of the present invention.

Referring to FIG. 1B, the memory block 2 may include a plurality of memory banks BK<a:h>. The plurality of memory banks BK<a:h> may be classified into up banks BK<a:d> and down banks BK<e:h>. For example, the up banks BK<a:d> may be arranged in an upper row of the memory block 2 and the down banks BK<e:h> may be arranged in an down row of the memory block 2. Further, one of the up banks and one of the down banks may be composed of one bank. That is, one of the up banks and one of the down banks may be a half bank, respectively.

The memory latch unit 3 may be configured to latch and output data which is outputted from the memory block 2 through a global input/output line GIO, to the data input/output unit 4 in response to a control signal PINB<0:5>.

The memory latch unit 3 may be a necessary component for providing a prefetch function according to the high speed operation of a semiconductor integrated circuit, and may include, for example, a pipe latch.

The control circuit 100 may be configured to generate a control signal PINB<0:5> in response to a column access signal CASPRDWTB, an address signal BA<0:2>, and a write state signal WTS.

In this case, the column access signal CASPRDWTB may be a column access strobe (CAS) signal generated according to a read command or a write command.

For convenience sake, the address signal BA<0:2> may be divided into a first address signal BA<2> and a second address signal BA<0:1>.

The first address signal BA<2> may be a bank address signal for selecting the up banks BK<a:d> or the down banks BK<e:h>.

The second address signal BA<0:1> may be a bank address signal for selecting one bank from among the up banks BK<a:d> or one bank from among the down banks BK<e:h>.

The write state signal WTS may be changed a logic level according to a write operation and a read operation of the semiconductor integrated circuit.

Figure 2:
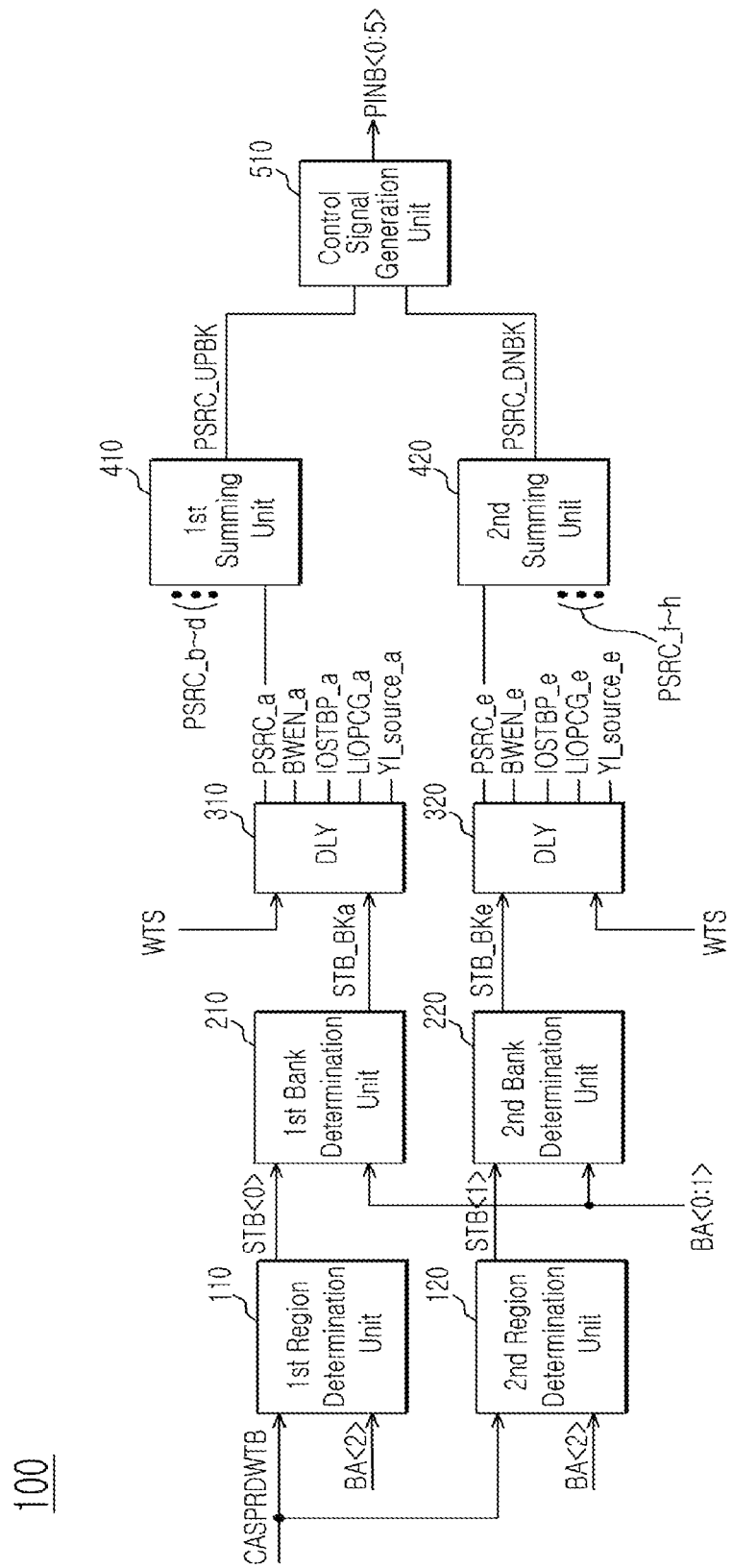
FIG. 2 is a block diagram illustrating the configuration of a control circuit capable of being implemented in the circuit of FIG. 1 according to one embodiment.

As shown in FIG. 2, a control circuit 100 according to one embodiment of the present invention may include a first region determination unit 110, a second region determination unit 120, a first bank determination unit 210, a second bank determination unit 220, a first delay unit 310, a second delay unit 320, a first summing unit 410, a second summing unit 420, and a control signal generation unit 510.

The first region determination unit 110 may be configured to generate a first strobe signal STB<0> in response to the column access signal CASPRDWTB and the first address signal BA<2>.

The first region determination unit 110 may be configured to generate the first strobe signal STB<0> in response to the column access signal CASPRDWTB when the first address signal BA<2> has, for example, a logic low value.

The second region determination unit 120 may be configured to generate a second strobe signal STB<1> in response to the column access signal CASPRDWTB and the first address signal BA<2>.

The second region determination unit 120 may be configured to generate the second strobe signal STB<1> in response to the column access signal CASPRDWTB when the first address signal BA<2> has, for example, a logic high value.

The first bank determination unit 210 may be configured to generate a first bank strobe signal STB_BKa in response to the first strobe signal STB<0> and the second address signal BA<0:1>.

The first bank determination unit 210 may be configured to generate the first bank strobe signal STB_BKa corresponding to a bank, e.g. BKa, designated by the second address signal BA<0:1>, using the first strobe signal STB<0>.

The second bank determination unit 220 may be configured to generate a second bank strobe signal STB_BKe in response to the second strobe signal STB<1> and the second address signal BA<0:1>.

The second bank determination unit 220 may be configured to generate the second bank strobe signal STB_BKe corresponding to a bank, e.g. BKe, designated by the second address signal BA<0:1>, using the second strobe signal STB<1>.

The first delay unit 310 may be configured to generate a first source signal PSRC_a using the first bank strobe signal STB_BKa according to the write state signal WTS.

The first delay unit 310 may be configured to generate a plurality of timing signals BWEN_a, IOSTBP_a, LIOPCG_a, and YI_source_a using the first bank strobe signal STB_BKa according to the write state signal WTS.

Here, the "BWEN_a" may be a bank write enable signal, the "IOSTBP_a" may be an input/output strobe signal, the "LIOPCG_a" may be a local I/O precharge signal, and the "YI_source_a" may be a column selection signal.

In this case, the first delay unit 310 may generate the signals for driving one, e.g. BKa, of up banks, and may be configured for each of the up banks BK<a:d>. That is, the first delay unit 310 may generate the "BWEN_a" which is the bank write enable signal for a selected up bank (for example, bank <a>), the "IOSTBP_a" which is the input/output strobe signal provided to the selected up bank, the "LIOPCG_a" which is the local I/O precharge signal provided to the selected up bank, and the "YI_source_a" which is the column selection signal provided to the selected up bank.

The second delay unit 320 may be configured to generate a second source signal PSRC_e using the second bank strobe signal STB_BKe according to the write state signal WTS.

The second delay unit 320 may be configured to generate a plurality of timing signals BWEN_e, IOSTBP_e, LIOPCG_e, and YI_source_e using the second bank strobe signal STB_BKe according to the write state signal WTS.

In this case, the second delay unit 320 may generate the signals for driving one, e.g. BKe, of down banks, and may be configured for each of the down banks BK<e:h>. That is, the second delay unit 320 may generate the "BWEN_e" which is the bank write enable signal for a selected down bank (for example, bank <e>), the "IOSTBP_e" which is the input/output strobe signal provided to the selected down bank, the "LIOPCG_e" which is the local I/O precharge signal provided to the selected down bank, and the "YI_source_a" which is the column selection signal provided to the selected down bank.

The first summing unit 410 may be configured to sum first source signals PSRC_a, PSRC_b, PSRC_c and PSRC_d according to each bank and to generate an up bank source signal PSRC_UPBK.

The second summing unit 420 may be configured to sum second source signals PSRC_e, PSRC_f, PSRC g and PSRC_h according to each bank and to generate a down bank source signal PSRC_DNBK.

For reference, the control block 100 may include a plurality of delaying unit (not shown) for generating the PSRC_b to PSRC d and PSRC f to PSRC h. The delaying units have a substantially same circuit-structure with the first and second delaying unit 310 and 320.

The control signal generation unit 510 may be configured to generate the control signal PINB<0:5> in response to the up bank source signal PSRC_UPBK and the down bank source signal PSRC_DNBK.

Figure 3:
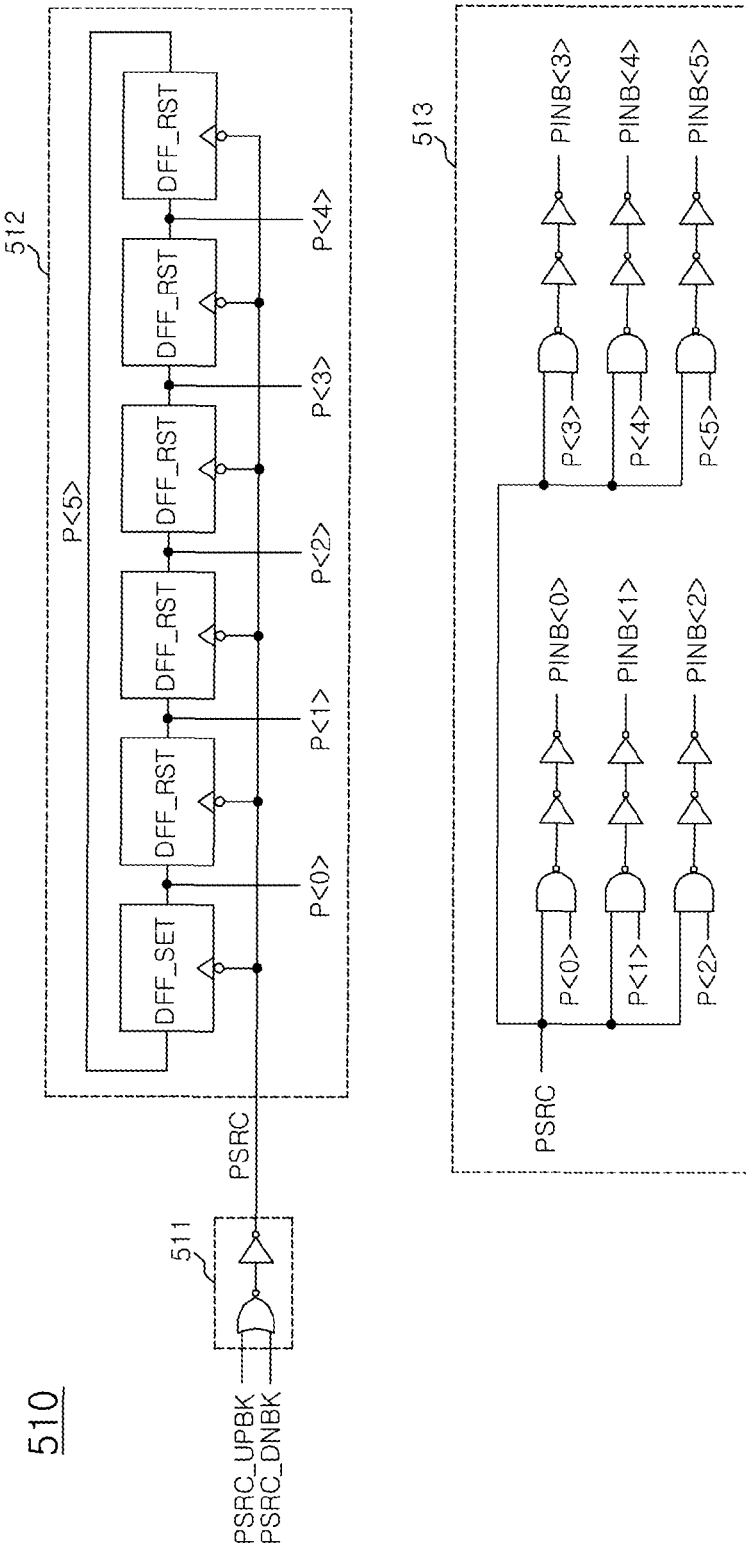
FIG. 3 is a circuit diagram illustrating the internal configuration of a control signal generation unit capable of being implemented in the circuit of FIG. 2.

Referring to FIG. 3, the control signal generation unit 510 may include a first combination logic 511, a shift register 512, and a second combination logic 513.

The first combination logic 511 may be configured to perform an OR operation on the up bank source signal PSRC_UPBK and down bank source signal PSRC_DNBK, and to generate an integrated source signal PSRC.

The shift register 512 may be configured to shift an initial value in regular sequence in response to an edge, e.g. a falling edge, of the integrated source signal PSRC, and to generate a plurality of shift signals P<0:5>.

The second combination logic 513 may be configured to perform a NAND operation on the integrated source signal PSRC and each of the shift signals P<0:5>, and to generate the control signal PINB<0:5>.

Figure 4:
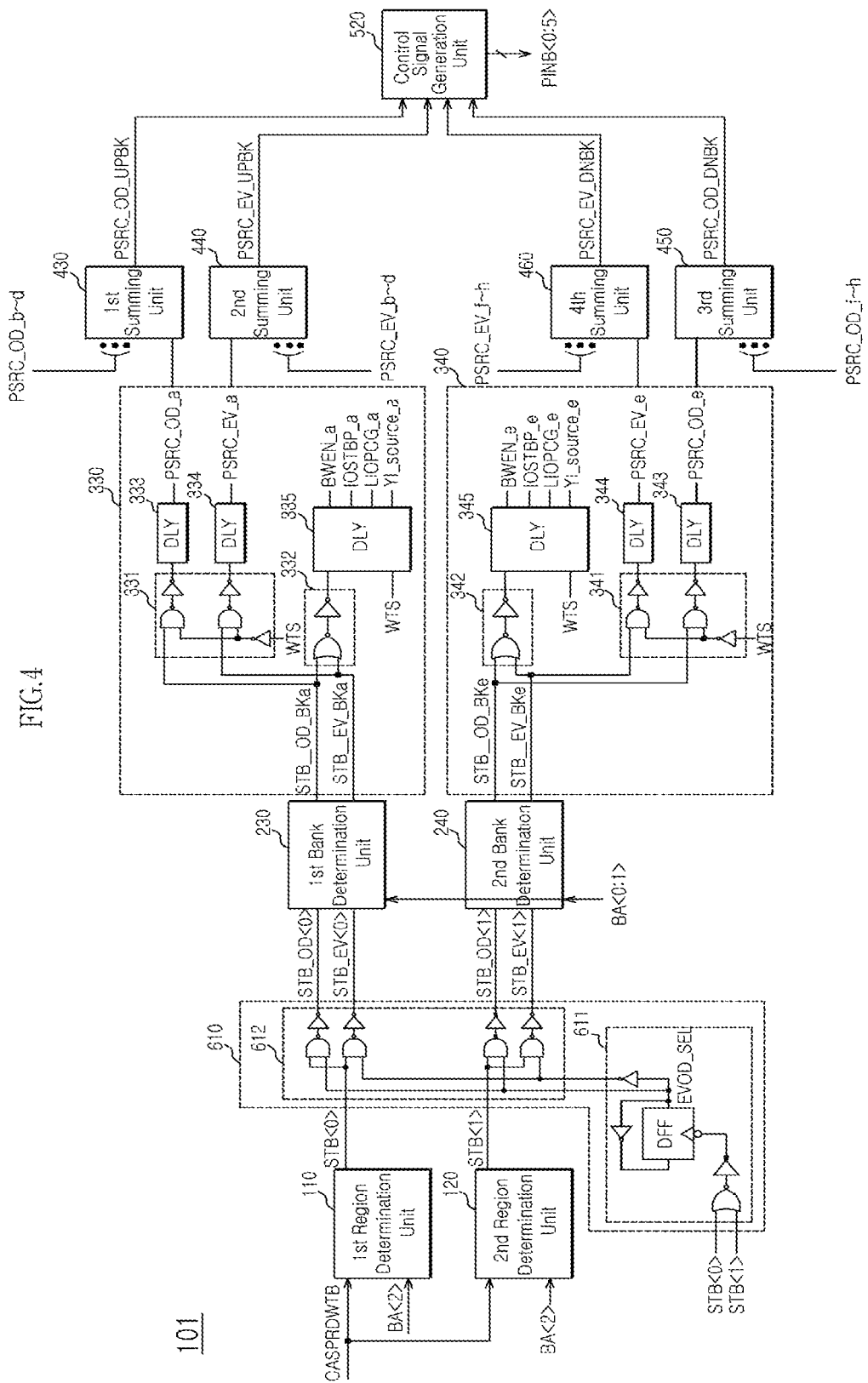
FIG. 4 a block diagram illustrating the configuration of a control circuit capable of being implemented in the circuit of FIG. 1 according to an embodiment.

Referring to FIG. 4, a control circuit 101 according to an embodiment of the present invention may include a first region determination unit 110, a second region determination unit 120, a first bank determination unit 230, a second bank determination unit 240, a first signal processing unit 330, a second signal processing unit 340, first to fourth summing units 430, 440, 450, and 460, and a control signal generation unit 520 and an order control unit 610.

The first region determination unit 110 may be configured to generate a first strobe signal STB<0> in response to the column access signal CASPRDWTB and the first address signal BA<2>.

The first region determination unit 110 may be configured to generate the first strobe signal STB<0> in response to the column access signal CASPRDWTB when the first address signal BA<2> has, for example, a logic low value.

The second region determination unit 120 may be configured to generate a second strobe signal STB<1> in response to the column access signal CASPRDWTB and the first address signal BA<2>.

The second region determination unit 120 may be configured to generate the second strobe signal STB<1> in response to the column access signal CASPRDWTB when the first address signal BA<2> has, for example, a logic high value.

The order control unit 610 may be coupled among the first and second region determination unit 110 and 120, and the first and second bank determination unit 230 and 240. T may be configured to generate a first order strobe signal pair STB_OD<0> and STB_EV<0> and a second order strobe signal pair STB_OD<1> and STB_EV<1> which are obtained by separating the first strobe signal STB<0> and second strobe signal STB<1> into an even-numbered order and an odd-numbered order, using an order selection signal EVDO_SEL generated in response to the first strobe signal STB<0> and second strobe signal STB<1>.

The order control unit 610 may include an order selection signal generation unit 611 and a control logic 612.

The order selection signal generation unit 611 may include a flip-flop and a plurality of logic gates.

The order selection signal generation unit 611 may be configured to toggle an order selection signal EVDO_SEL in response to the falling edges of the first strobe signal STB<0> and second strobe signal STB<1>.

The control logic 612 may include a plurality of logic gates.

The control logic 612 may be configured to generate the first order strobe signal pair STB_OD<0> and STB_EV<0> by separating the first strobe signal STB<0> into an even-numbered order and an odd-numbered order in response to the order selection signal EVDO_SEL and an inverted order selection signal EVDO_SEL. Further, the control logic 612 may be configured to generate the second order strobe signal pair STB_OD<1> and STB_EV<1> by separating the second strobe signal STB<1> into an even-numbered order and an odd-numbered order in response to the order selection signal EVDO_SEL and an inverted order selection signal EVDO_SEL.

The first bank determination unit 230 may be configured to generate a first bank order strobe signal pair STB_OD_BKa and STB_EV_BKa in response to the first order strobe signal pair STB_OD<0> and STB_EV<0> and the second address signal BA<0:1>.

The first bank determination unit 230 may be configured to generate the first bank order strobe signal pair STB_OD_BKa and STB_EV_BKa corresponding to a bank, e.g. BKa, designated by the second address signal BA<0:1> using the first order strobe signal pair STB_OD<0> and STB_EV<0>.

The second bank determination unit 240 may be configured to generate a second bank order strobe signal pair STB_OD_BKe and STB_EV_BKe in response to the second order strobe signal pair STB_OD<1> and STB_EV<1> and the second address signal BA<0:1>.

The second bank determination unit 240 may be configured to generate the second bank order strobe signal pair STB_OD_BKe and STB_EV_BKe corresponding to a bank, e.g. BKe, designated by the second address signal BA<0:1> using the second order strobe signal pair STB_OD<1> and STB_EV<1>.

The first signal processing unit 330 may be configured to control the timing of the first bank order strobe signal pair STB_OD_BKa and STB_EV_BKa according to the write state signal WTS, and to generate a first odd source signal pair PSRC_OD_a and PSRC_EV_a.

The first signal processing unit 330 may be configured to control the timing of the first bank order strobe signal pair STB_OD_BKa and STB_EV_BKa according to the write state signal WTS, and to generate a plurality of timing signals BWEN_a, IOSTBP_a, LIOPCG_a, and YI_source_a.

The first signal processing unit 330 may include a first combination unit 331, a second combination unit 332, and a plurality of delay units 333, 334 and 335.

The first combination unit 331 may be configured to pass the first bank order strobe signal pair STB_OD_BKa and STB_EV_BKa when the write state signal WTS has a logic low level, i.e. a level defining a read operation.

The second combination unit 332 may be configured to perform an OR operation on the first bank order strobe signal pair STB_OD_BKa and STB_EV_BKa.

The delay units 333 and 334 may be configured to delay the output signal of the first combination unit 331 by a set time period, and then to output the output signal of the first combination unit 331 as the first order source signal pair PSRC_OD_a and PSRC_EV_a.

The delay unit 335 may be configured to delay the output signal of the second combination unit 332 by mutually different time periods when the write state signal WTS has a logic high level, i.e. a level defining a write operation, and then to output a plurality of timing signals BWEN_a, IOSTBP_a, LIOPCG_a, and YI_source_a.

In this case, the first signal processing unit 330 may generate the signals for driving one, e.g. BKa, of up banks, and may be configured for each of the up banks BK<a:d>.

The second signal processing unit 340 may be configured to control the timing of the second bank order strobe signal pair STB_OD_BKe and STB_EV_BKe according to the write state signal WTS, and to generate a second order source signal pair PSRC_OD_e and PSRC_EV_e.

The second signal processing unit 340 may be configured to control the timing of the second bank order strobe signal pair STB_OD_BKe and STB_EV_BKe according to the write state signal WTS, and to generate a plurality of timing signals BWEN_e, IOSTBP_e, LIOPCG_e, and YI_source_e.

The second signal processing unit 340 may include a first combination unit 341, a second combination unit 342, and a plurality of delay units 343, 344 and 345.

The first combination unit 341 may be configured to pass the second bank order strobe signal pair STB_OD_BKe and STB_EV_BKe when the write state signal WTS has a logic low level, i.e. a level defining a read operation.

The second combination unit 342 may be configured to perform an OR operation on the second bank order strobe signal pair STB_OD_BKe and STB_EV_BKe.

The delay units 343 and 344 may be configured to delay the output signal of the first combination unit 341 by a set time period, and then to output the output signal of the first combination unit 341 as the second order source signal pair PSRC_OD_e and PSRC_EV_e.

The delay unit 345 may be configured to delay the output signal of the second combination unit 342 by mutually different time periods when the write state signal WTS has a logic high level, i.e. a level defining a write operation, and then to output a plurality of timing signals BWEN_e, IOSTBP_e, LIOPCG_e, and YI_source_e.

In this case, the second signal processing unit 340 may generate the signals for driving one, e.g. BKe, of down banks, and may be configured for each of the down banks BK<e:h>.

The first summing unit 430 may be configured to sum up first odd source signals PSRC_OD_a, PSRC_OD_b, PSRC_OD_c and PSRC_OD_d according to banks and to generate an up bank odd source signal PSRC_OD_UPBK.

The second summing unit 440 may be configured to sum up first even source signals PSRC_EV_a, PSRC_EV_b, PSRC_EV_c and PSRC_EV_d according to banks and to generate an up bank even source signal PSRC_EV_UPBK.

The third summing unit 450 may be configured to sum up second odd source signals PSRC_OD_e, PSRC_OD_f, PSRC_OD_g and PSRC_OD_h according to banks and to generate a down bank odd source signal PSRC_OD_DNBK.

The fourth summing unit 460 may be configured to sum up second even source signals PSRC_EV_e, PSRC_EV_f, PSRC_EV_g and PSRC_EV_h according to banks and to generate a down bank even source signal PSRC_EV_DNBK.

The control signal generation unit 520 may be configured to generate a control signal PINB<0:5> in response to the up bank odd source signal PSRC_OD_UPBK, the up bank even source signal PSRC_EV_UPBK, the down bank odd source signal PSRC_OD_DNBK, and the down bank even source signal PSRC_EV_DNBK.

Figure 5:
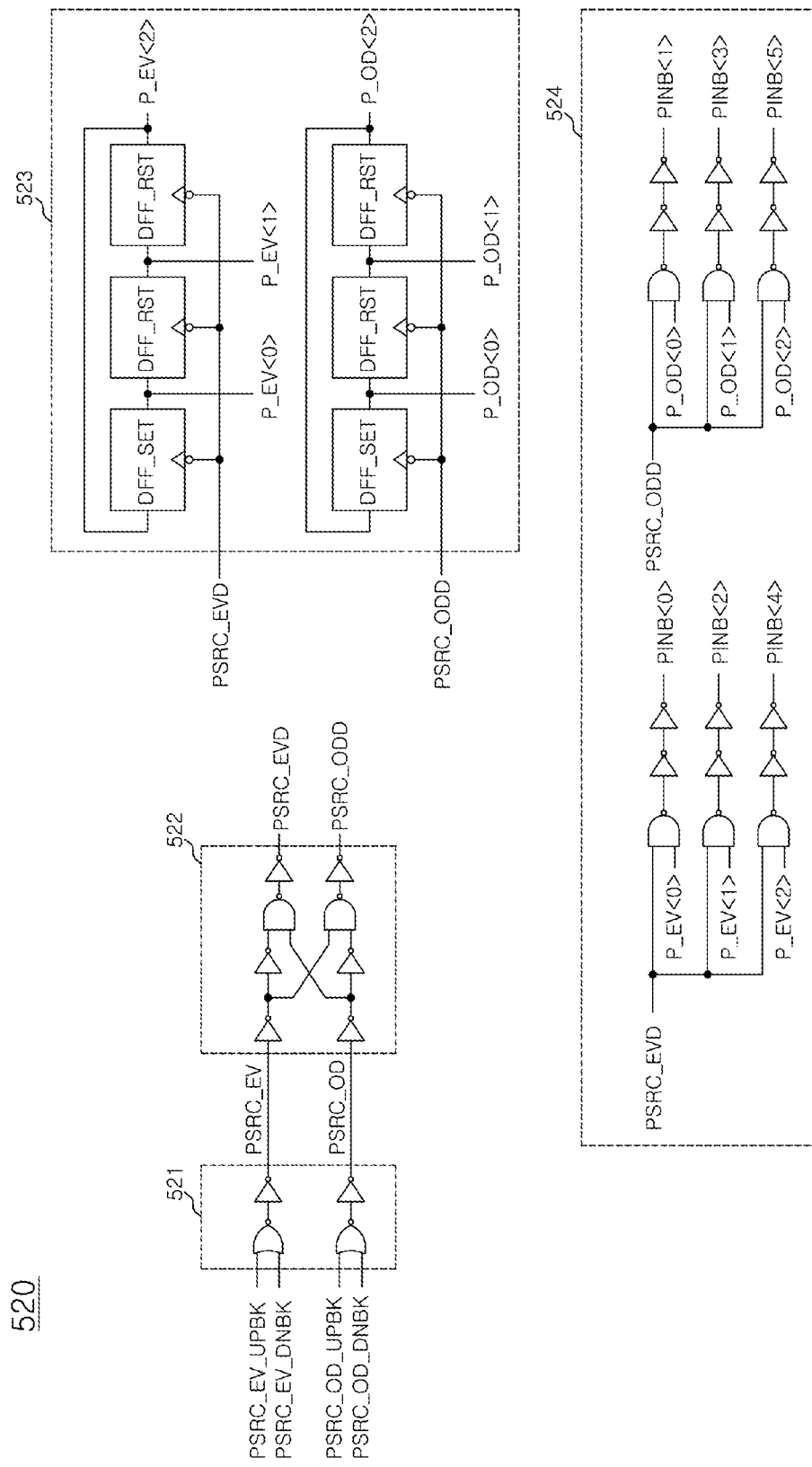
FIG. 5 is a circuit diagram illustrating the internal configuration of a control signal generation unit capable of being implemented in the circuit of FIG. 4.

As shown in FIG. 5, the control signal generation unit 520 may include a first combination logic 521, an overlap prevention unit 522, a shift register 523, and a second combination logic 524.

The first combination logic 521 may be configured to generate an output signal PSRC_EV obtained by performing an OR operation on even-numbered signals and an output signal PSRC_OD obtained by performing an OR operation on odd-numbered signals, with respect to the up bank odd source signal PSRC_OD_UPBK, the up bank even source signal PSRC_EV_UPBK, the down bank odd source signal PSRC_OD_DNBK, and the down bank even source signal PSRC_EV_DNBK.

The overlap prevention unit 522 may be configured to generate an integrated even source signal PSRC_EVD and an integrated odd source signal PSRC_ODD, which are prevented from overlapping each other. The overlap prevention unit 522 may be configured to receive the output signals PSRC_EV and PSRC_OD and to pass one of the output signals when the other signal of the output signals is inactivated. The overlap prevention unit may include a plurality logic gates and the plurality logic gates may be properly coupled to perform the above operation.

By the configuration described above, it is possible to prevent an error in which one of the integrated even source signal PSRC_EVD and integrated odd source signal PSRC_ODD is at an improper timing.

The shift register 523 may be configured to shift the respective initial values in response to the respective edges, e.g. falling edges, of the integrated even source signal PSRC_EVD and integrated odd source signal PSRC_ODD, and to generate a plurality of first shift signals P_EV<0:2> and a plurality of second shift signals P_OD<0:2>.

The shift register 523 may include a plurality of flip-flops.

The second combination logic 524 may be configured to generate a control signal PINB<0:5> by performing a NAND operation on the integrated even source signal PSRC_EVD and each of the plurality of first shift signals P_EV<0:2> and by performing a NAND operation on the integrated odd source signal PSRC_ODD and each of the plurality of second shift signals P_OD<0:2>.

Figure 6:
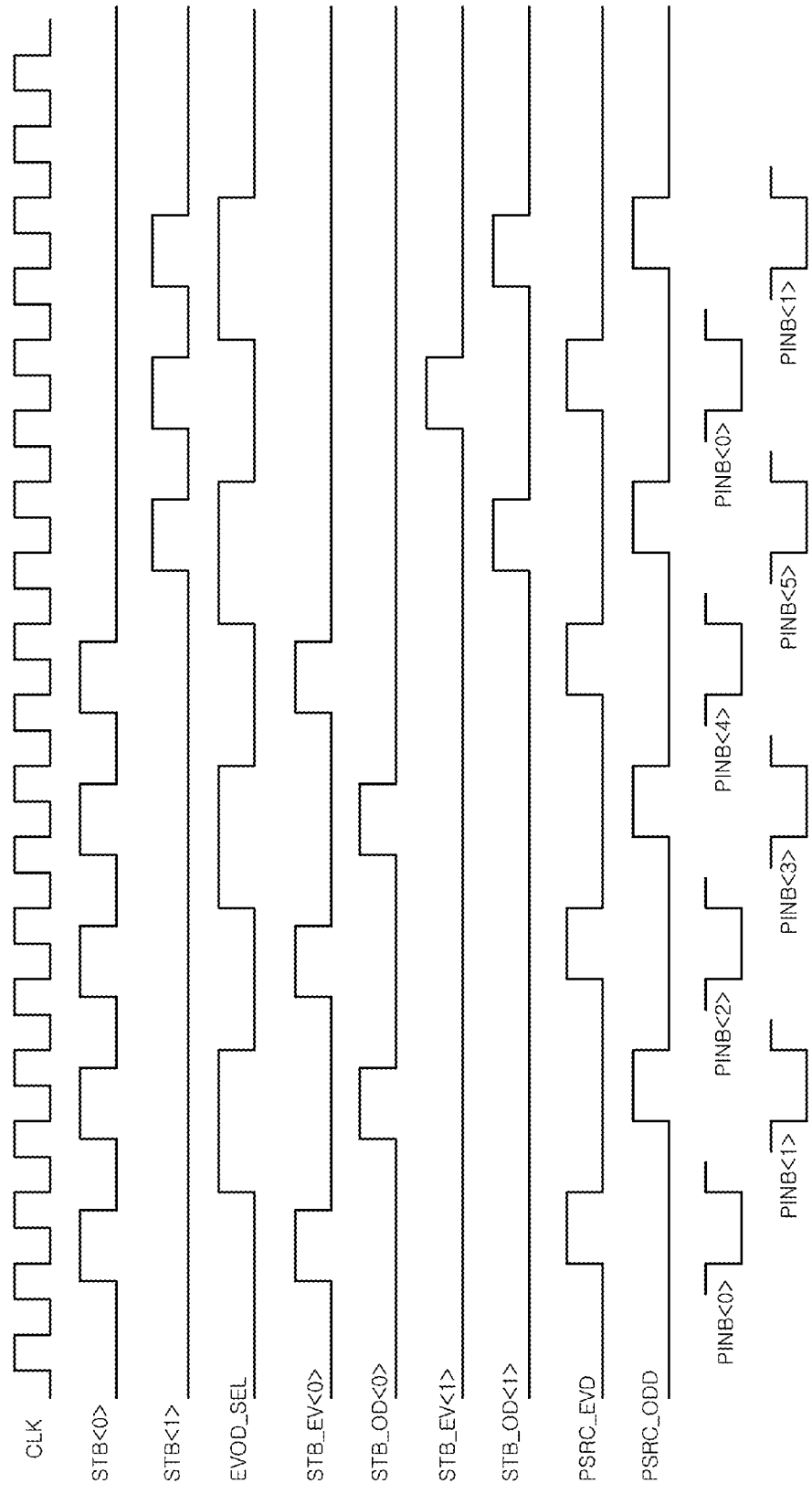
FIG. 6 is an operation timing diagram illustrating the control circuit according to an embodiment.

The operation of the control circuit 101 will be described below with reference to FIG. 6.

Referring the FIG. 6, an operation of the control circuit 101 is described as follows.

For example, it is assumed that five accesses to the up banks BK<a:d> are consecutively performed, and then three accesses to the down banks BK<e:h> are performed to perform a data read operation.

Since five accesses to the up bank BK<a:d> are consecutively performed and then three accesses to the down bank BK<e:h> are performed, the first strobe signal STB<0> is generated five times and the second strobe signal STB<1> is generated three times.

According to the first strobe signal STB<0> and second strobe signal STB<1>, the order selection signal EVDO_SEL is toggled.

A first order strobe signal pair STB_OD<0> and STB_EV<0> and a second order strobe signal pair STB_OD<1> and STB_EV<1> are generated according to the order selection signal EVDO_SEL. For example, the first order strobe signal pair STB_OD<0> and STB_EV<0> may be separated and generated in a toggle period of the first strobe signal STB<0>, according to a logic level of the order selection signal EVDO_SEL. Further, the second order strobe signal STB_OD<1> and STB_EV<1> may be separated and generated in a toggle period of the second strobe signal STB<1>, according to a logic level of the order selection signal EVDO_SEL.

An integrated even source signal PSRC_EVD is generated by incorporating the first even order strobe signal STB_EV<0> and the first odd order strobe signal STV_EV<1>.

In addition, an integrated odd source signal PSRC_ODD is generated by incorporating the first odd order strobe signal STB_OD<0> and the second odd order strobe signal STB_OD<1>.

According to the integrated even source signal PSRC_EVD and the integrated odd source signal PSRC_ODD, a control signal PINB<0:5> is generated.

When the up bank BK<a:d> are accessed consecutively, the up bank BK<a:d> may activate the integrated even source signal PSRC_EVD at a timing later than a normal timing. In this case, an error may occur in the control signal PINB<0:5>, thereby causing a defect in the data read operation.

However, according to the this embodiment as described above, a first order strobe signal pair STB_OD<0> and STB_EV<0> and a second order strobe signal pair STB_OD<1> and STB_EV<1>, each of which is separated into an even order and an odd order, are generated. In addition, as described with reference to FIG. 5, the integrated even source signal PSRC_EVD and the integrated odd source signal PSRC_ODD are prevented from overlapping each other by the overlap prevention unit 522.

Therefore, although consecutive accesses to the up bank BK<a:d> or down bank BK<e:h> are generated, a control signal PINB<0:5> having a normal timing can be generated, so that data can be normally latched.

Figure 7:
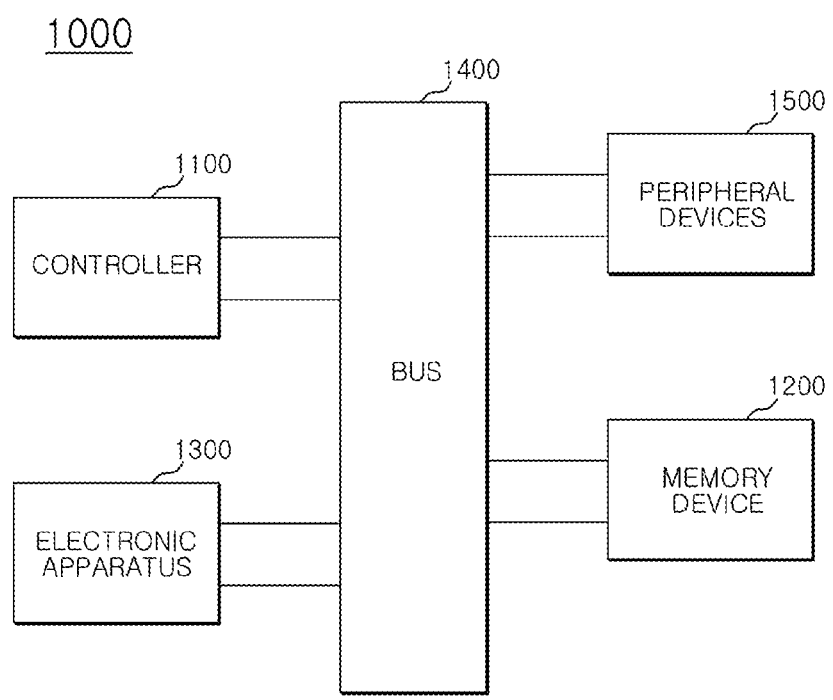
FIG. 7 is a block diagram of various features of an electronic system, according to various embodiments of the invention.

Referring FIG. 7, an electronic system 1000 may include a controller 1100 and a memory device 1200. Memory device 1200 may be configured as a semiconductor integrated circuit, in accordance with embodiments taught herein, and may be similar to or identical to one or more of the embodiments discussed with respect to FIGS. 1A-6. System 1000 may be formed in various ways such as coupling the individual components of system 1100 together or integrating the components into one or a number of chip-based units using conventional techniques. In an embodiment, system 1000 also includes an electronic apparatus 1300 and a bus 1400, where the bus 1400 provides electrical conductivity among the components of system 1000. In an embodiment, the bus 1400 includes an address bus, a data bus, and a control bus, each independently configured. In an alternative embodiment, the bus 1400 uses common conductive lines for providing one or more of address, data, or control, the use of which is regulated by controller 1100. In an embodiment, electronic apparatus 1300 may include additional memory for the intended functional applications of electronic system 1000. The memory device 1200 are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. The memory device 1200, in accordance with various embodiments as illustrated in FIGS. 1A-6, may be realized in the read operation and the write operation using the test pads.

In various embodiments, peripheral device or devices 1500 are coupled to the bus 1400. Peripheral devices 1400 may include displays, imaging devices, printing devices, wireless devices, wireless interfaces (e.g. wireless transceivers), additional storage memory, control devices that may operate in conjunction with controller 1100, In an embodiment, controller 1100 may include one or more processors. In various embodiments, system 1100 includes, but is not limited to, fiber optic systems or devices, electro-optic systems or devices, optical systems or devices, imaging systems or devices, and information handling systems or devices such as wireless systems or devices, telecommunication systems or devices, and computers.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A semiconductor integrated circuit comprising:
   a memory block partitioned into a first region and a second region;
   a data latch unit configured to latch data outputted from the memory block in response to a control signal; and
   a control circuit configured to generate the control signal in response to source signals,
   wherein the source signals are generated alternately with an odd order and an even order in response to column access signals consecutively inputted to access one of the first region and the second region consecutively.

2. The circuit according to claim 1, wherein the data latch unit comprises a pipe latch.

3. The circuit according to claim 1, wherein the column access signals are generated according to read commands.

4. The circuit according to claim 1, wherein the control circuit is configured to generate a first strobe signal for access the first region and a second strobe signal for access the second region using the column access signals.

5. The circuit according to claim 4, wherein the control circuit is configured to separate each of a first strobe signal and a second strobe signal into an odd order and an even order, and to generate the source signals.

* * * * *